(12) United States Patent
Ogura

(10) Patent No.: US 7,908,507 B2
(45) Date of Patent: Mar. 15, 2011

(54) APPARATUS AND METHOD FOR MASKING INPUT OF INVALID DATA STROBE SIGNAL

(75) Inventor: Kiyonori Ogura, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 842 days.

(21) Appl. No.: 11/896,670

(22) Filed: Sep. 5, 2007

(65) Prior Publication Data

US 2009/0006881 A1    Jan. 1, 2009

Related U.S. Application Data

(63) Continuation-in-part of application No. 11/445,144, filed on Jun. 2, 2006, now abandoned.

(30) Foreign Application Priority Data

Feb. 28, 2006  (JP) ................................. 2006-052909
Feb. 27, 2007  (JP) ................................. 2007-048022

(51) Int. Cl.
  *G06F 1/04* (2006.01)
(52) U.S. Cl. ......... 713/500; 713/502; 713/503; 713/401; 365/189.15; 365/193; 365/195; 365/196
(58) Field of Classification Search .................... 713/500
See application file for complete search history.

(56) References Cited

U.S. PATENT DOCUMENTS

| | | | |
|---|---|---|---|
| 6,600,681 B1 * | 7/2003 | Korger et al. | 365/193 |
| 6,621,760 B1 * | 9/2003 | Ahmad et al. | 365/233.1 |
| 6,680,866 B2 * | 1/2004 | Kajimoto | 365/189.16 |
| 6,785,189 B2 * | 8/2004 | Jacobs et al. | 365/233.13 |
| 6,853,594 B1 * | 2/2005 | Wu et al. | 365/193 |
| 7,038,953 B2 * | 5/2006 | Aoki | 365/189.05 |
| 7,177,230 B1 * | 2/2007 | Huang | 365/233.1 |
| 7,619,404 B2 * | 11/2009 | LaBerge | 324/158.1 |
| 2005/0152209 A1 * | 7/2005 | Shin et al. | 365/233 |

FOREIGN PATENT DOCUMENTS

JP    2003-085974 A    3/2003

* cited by examiner

*Primary Examiner* — Nitin C Patel
(74) *Attorney, Agent, or Firm* — Fujitsu Patent Center

(57) ABSTRACT

To provide a data fetch circuit, which reliably cuts off transmission of a high impedance state of a data strobe signal even if a manufacture condition or an operation condition is changed, and a control method thereof. The data fetch circuit includes an RL measuring part 10 measuring a latency measurement value RLB from an input of a read instruction signal RD to a valid edge of a data strobe signal DQS and an RL count comparing part 30 outputting a BL count start signal BST giving an instruction of a cancel of the cut-off of the data strobe signal DQS after standing by during the time based on the latency measurement value RLB in accordance with an input of a delay read instruction signal RDD.

27 Claims, 14 Drawing Sheets

BLOCK DIAGRAM SHOWING STRUCTURE OF DATA FETCH CIRCUIT ACCORDING TO FIRST EMBODIMENT

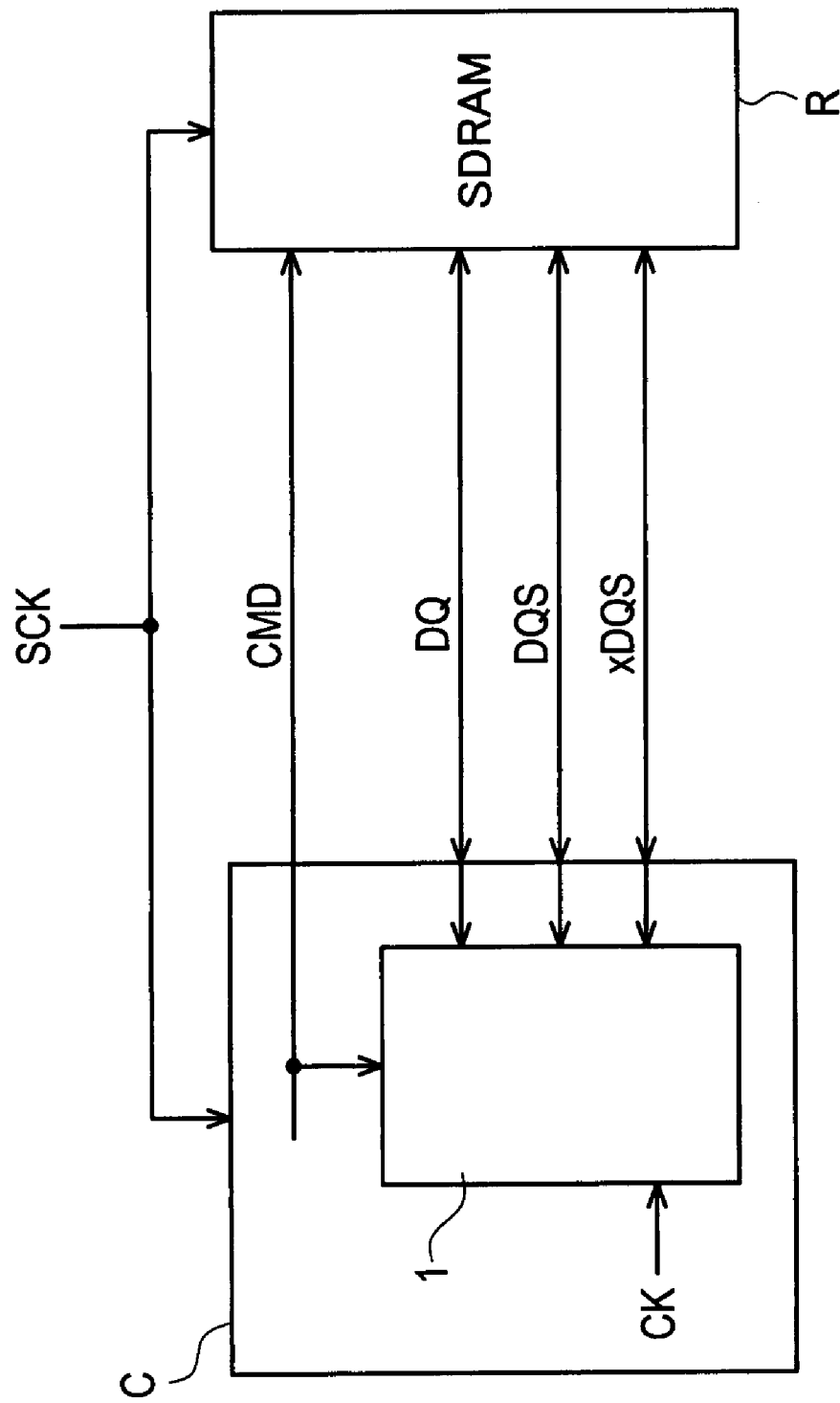

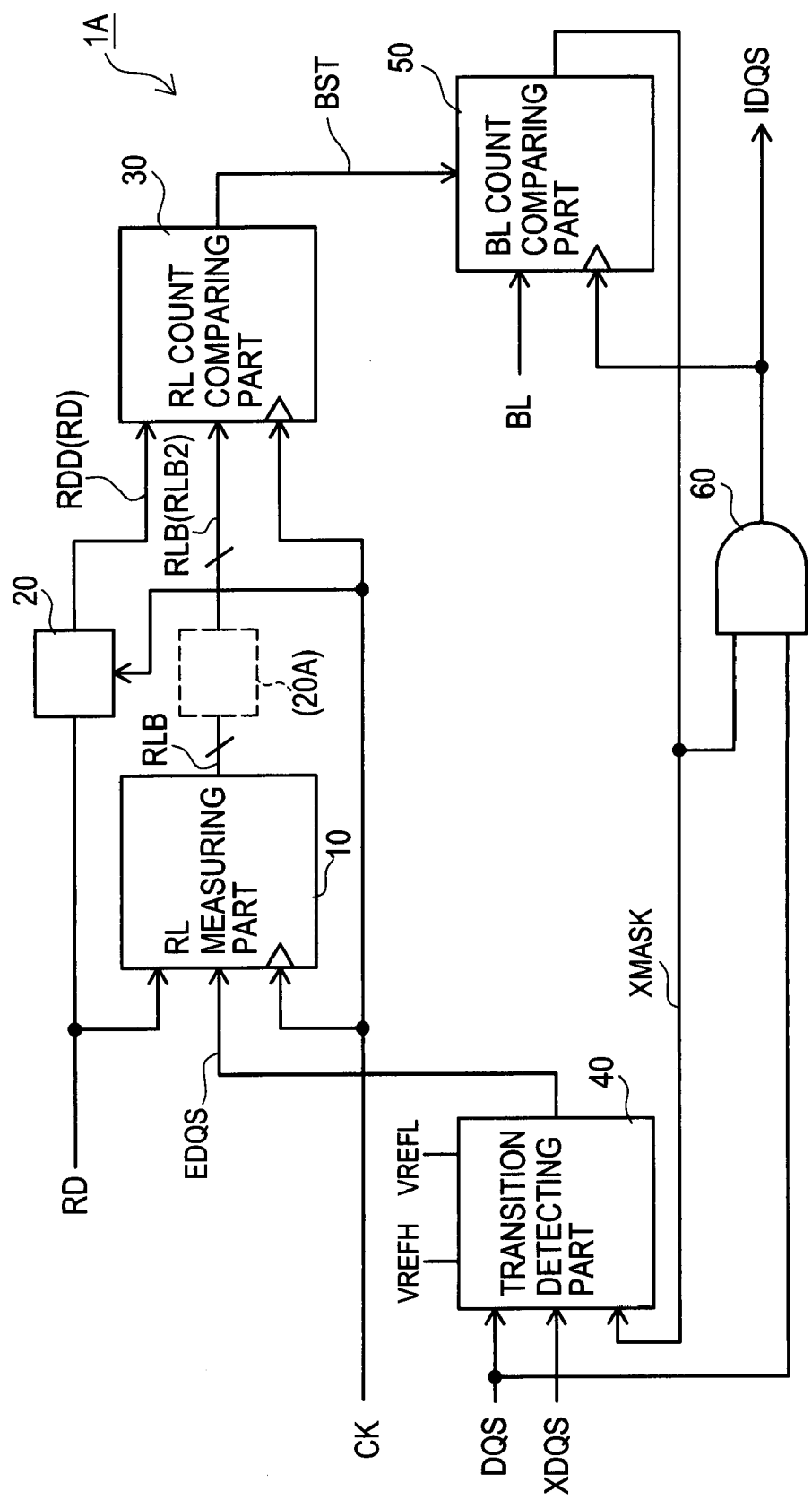
FIG. 2 BLOCK DIAGRAM SHOWING STRUCTURE OF DATA FETCH CIRCUIT ACCORDING TO FIRST EMBODIMENT

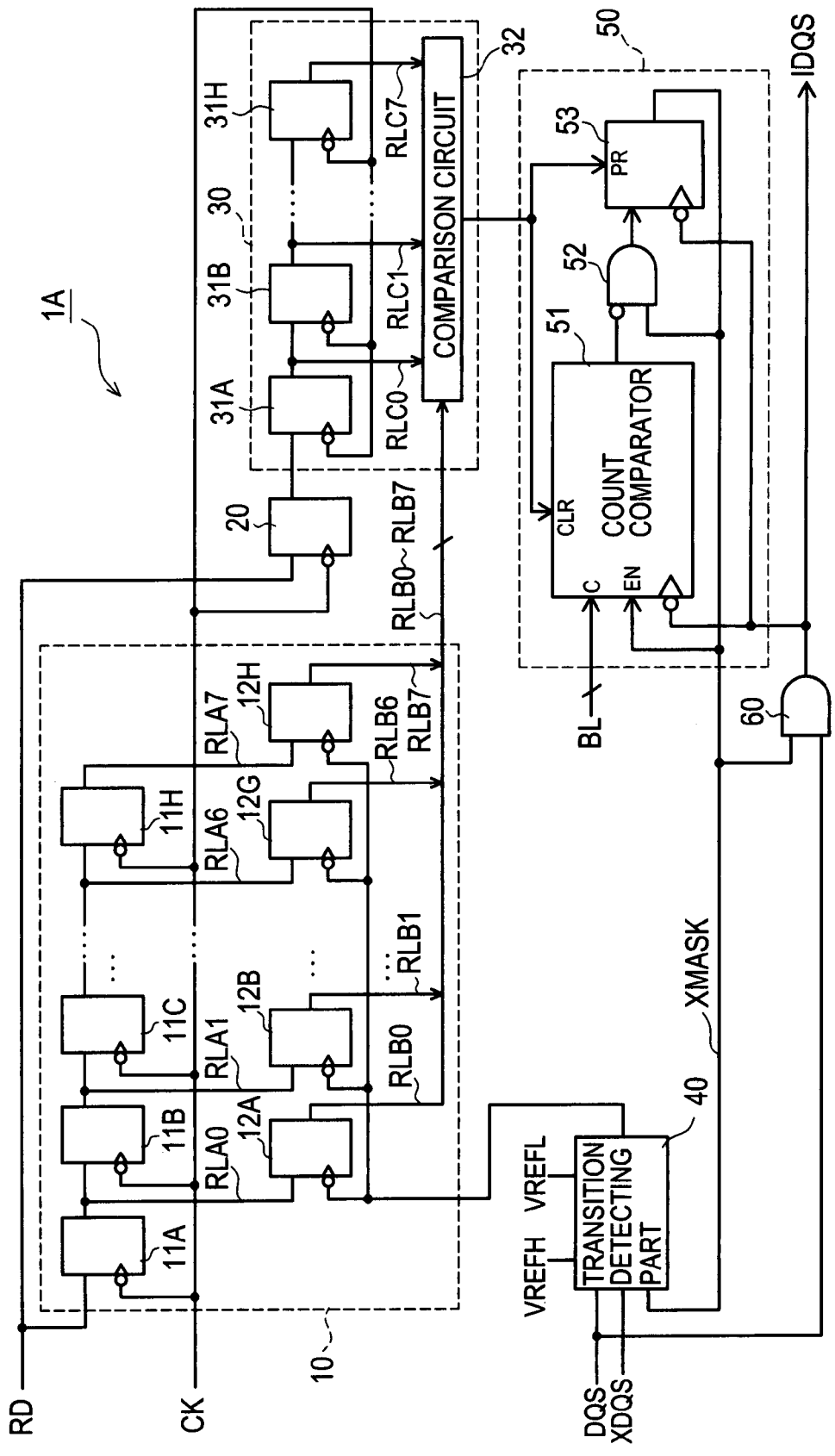
FIG. 3 CIRCUIT DIAGRAM SHOWING SPECIFIC EXAMPLE OF DATA FETCH CIRCUIT

FIG. 4   CIRCUIT DIAGRAM SHOWING EXAMPLE OF TRANSITION DETECTING PART
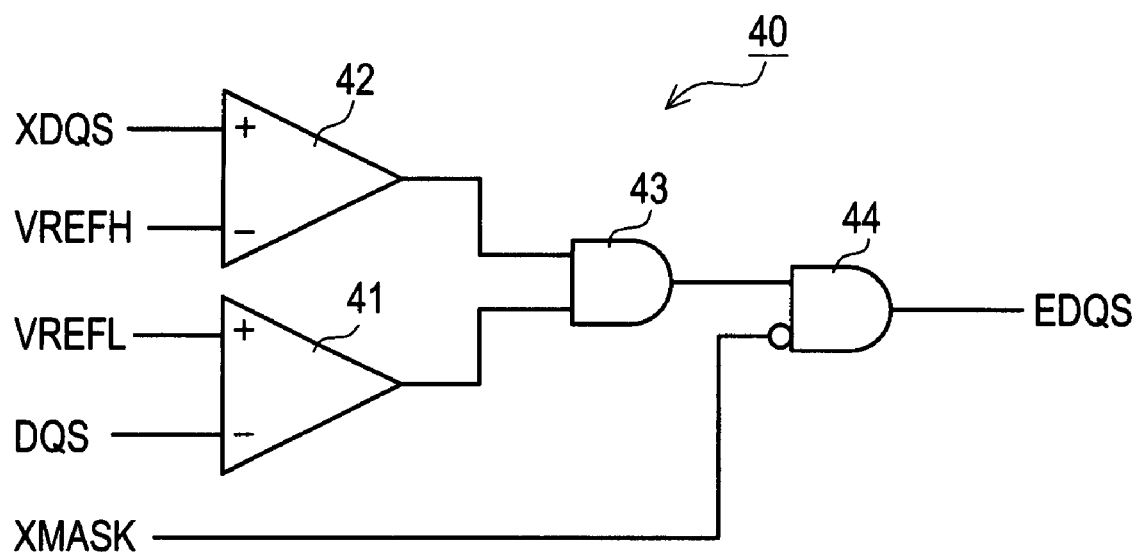

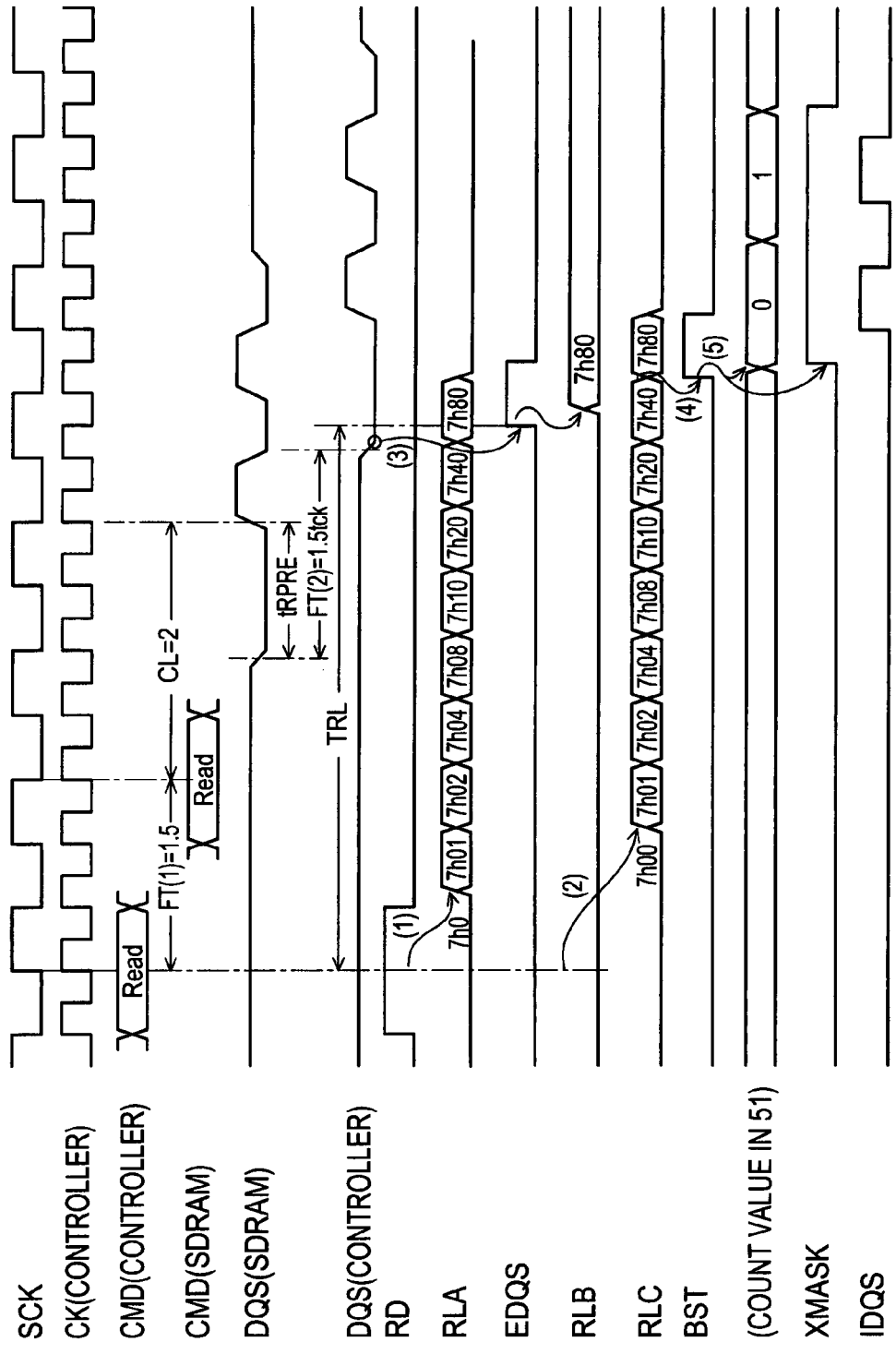
FIG. 5 TIMING CHART SHOWING OPERATION OF DATA FETCH CIRCUIT ACCORDING TO FIRST EMBODIMENT

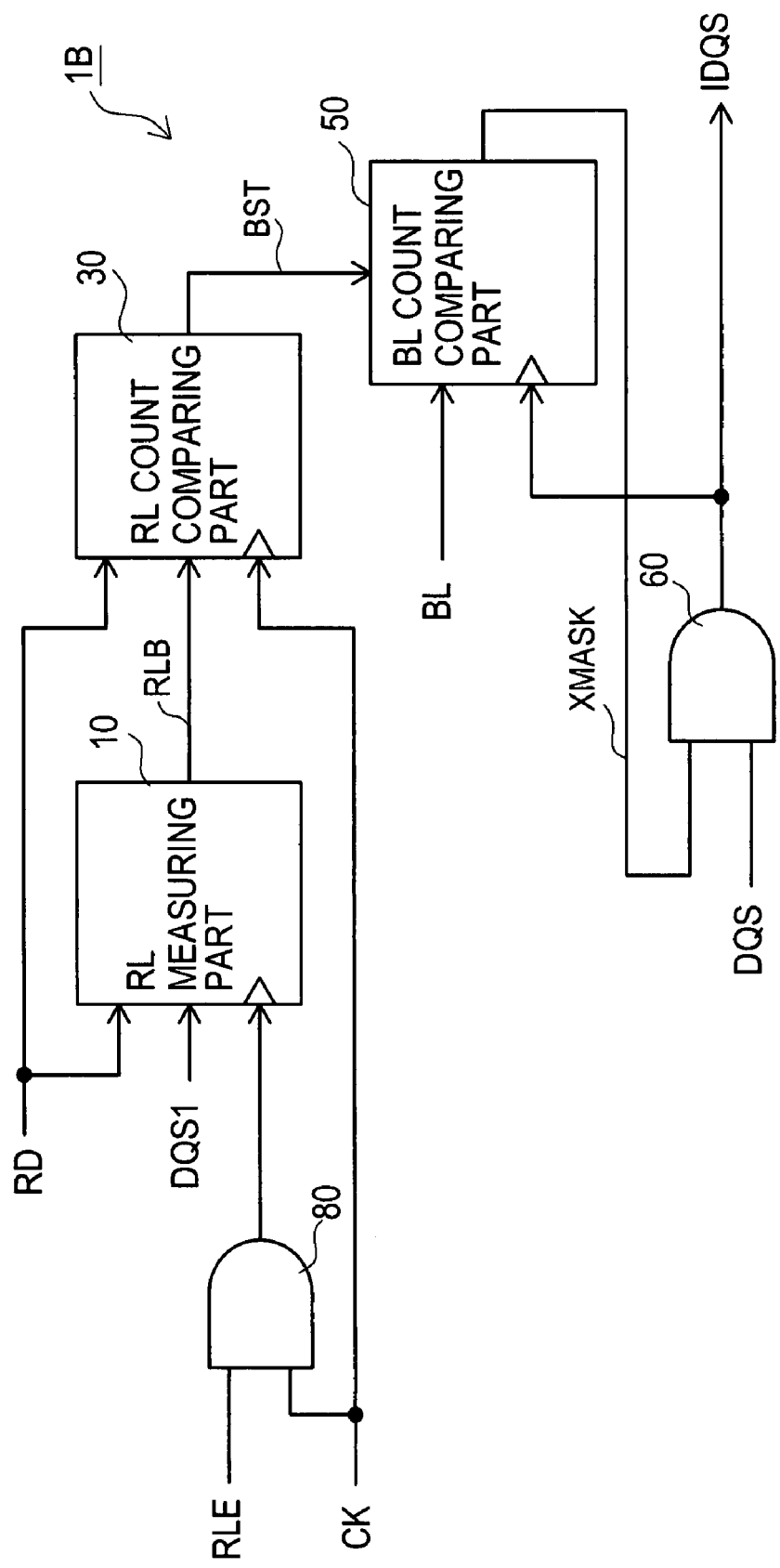
FIG. 6 BLOCK DIAGRAM SHOWING STRUCTURE OF DATA FETCH CIRCUIT ACCORDING TO SECOND EMBODIMENT

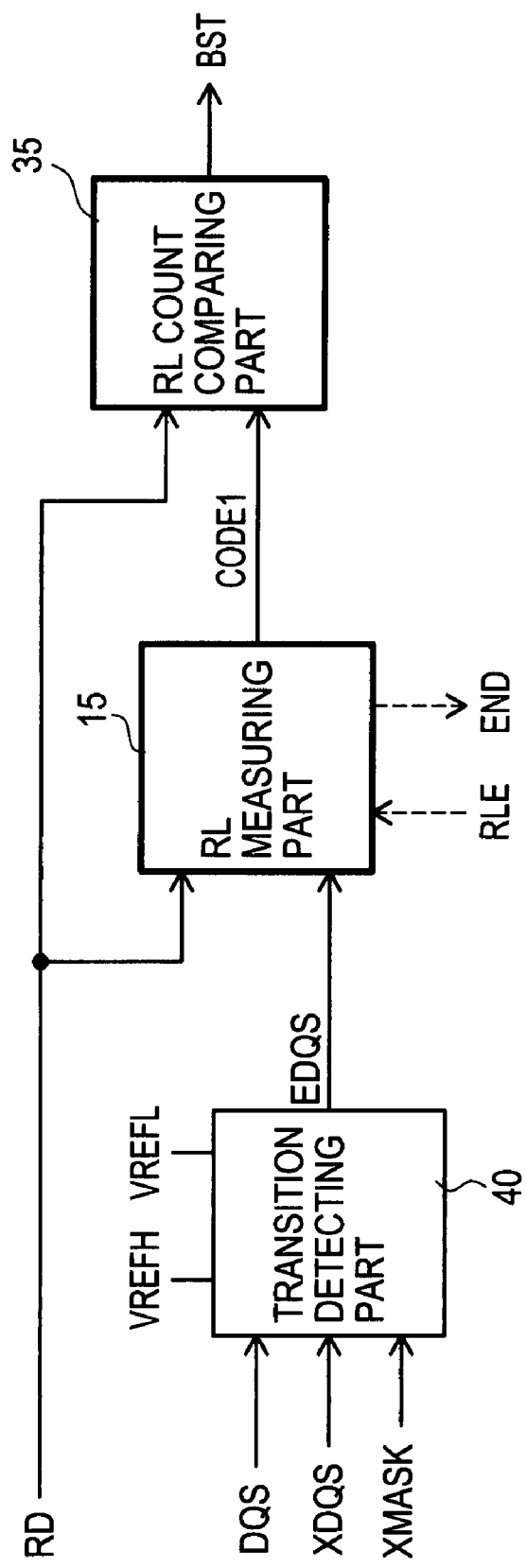
FIG. 7  BLOCK DIAGRAM SHOWING STRUCTURE OF DATA FETCH CIRCUIT ACCORDING TO THIRD EMBODIMENT

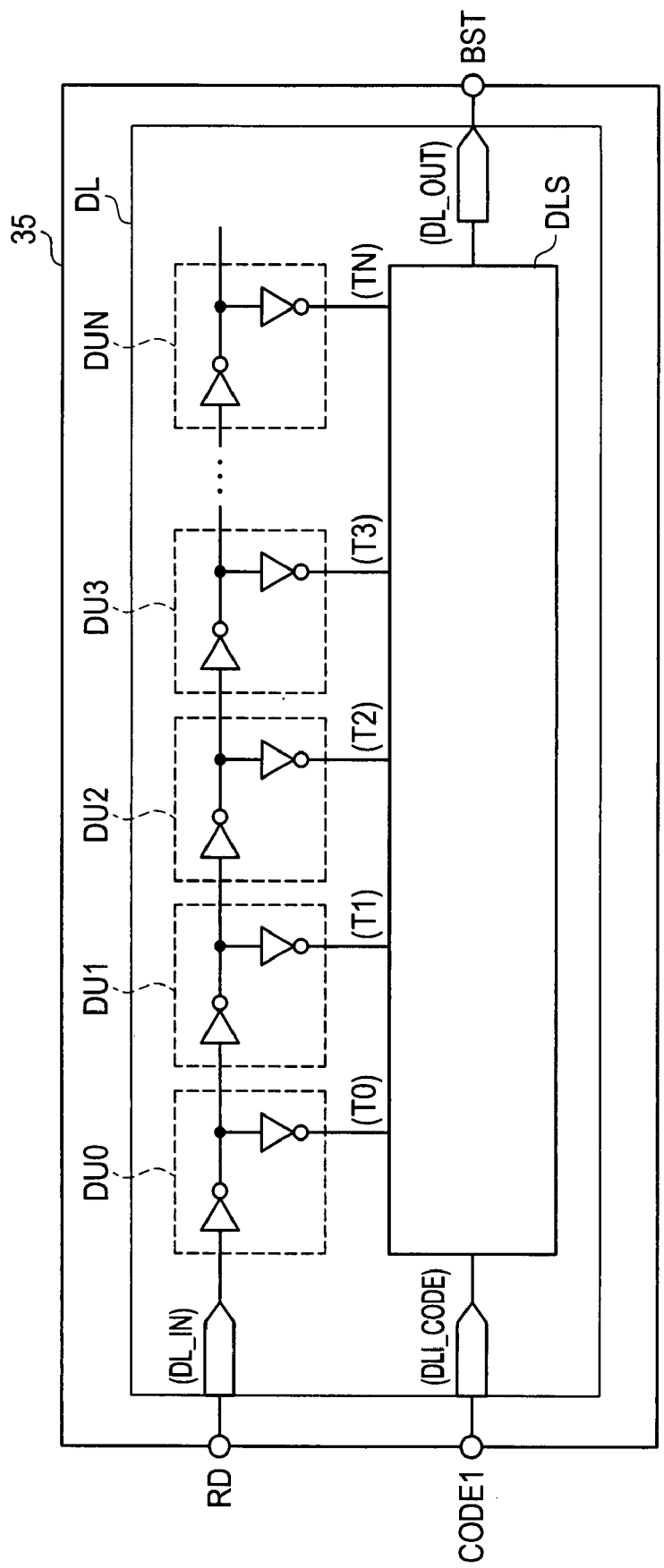
FIG. 8 DIAGRAM OF RL COUNT COMPARING PART ACCORDING TO THIRD EMBODIMENT

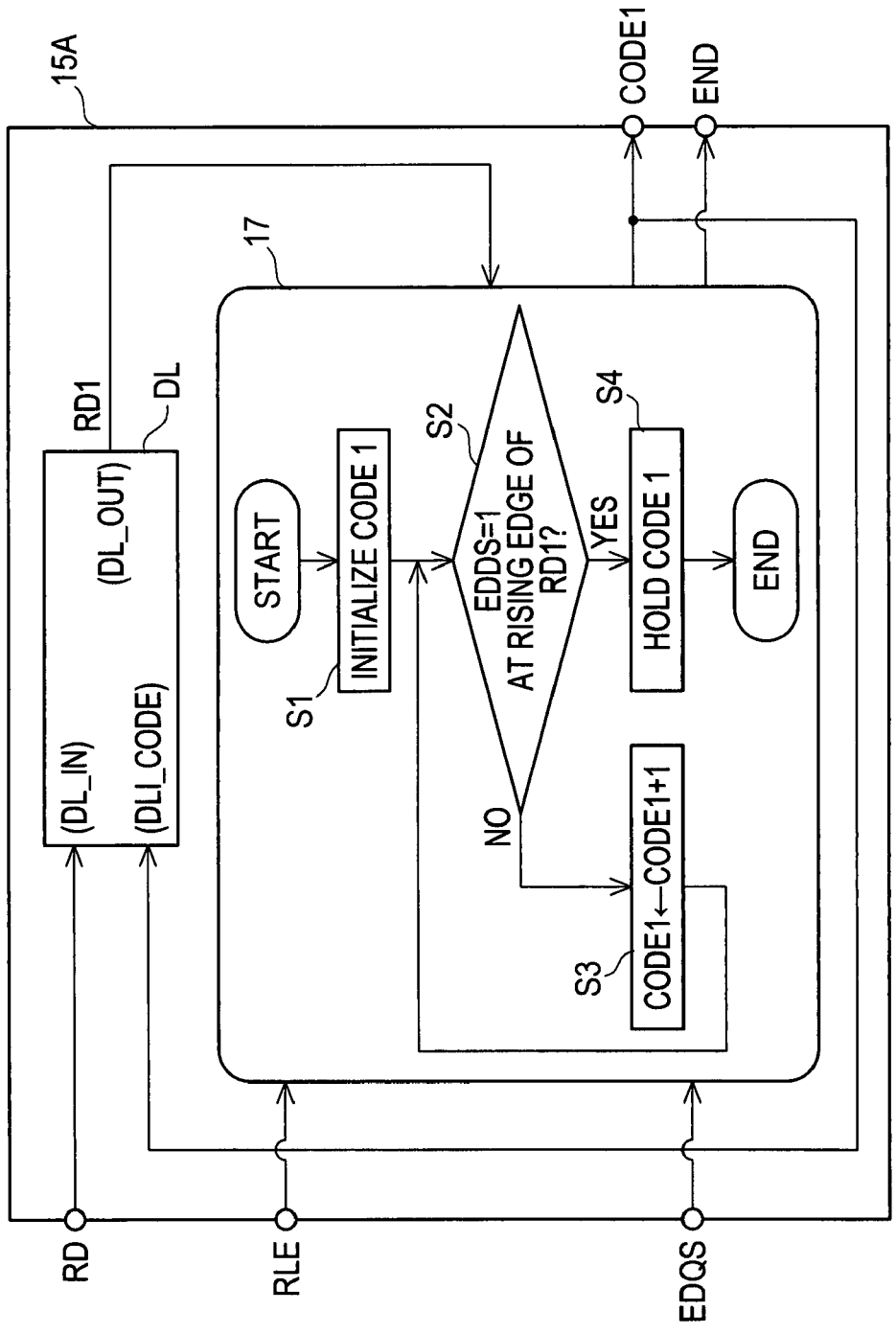
FIG. 9 DIAGRAM OF RL MEASURING PART APPLIED TO FIRST SPECIFIC EXAMPLE OF THIRD EMBODIMENT

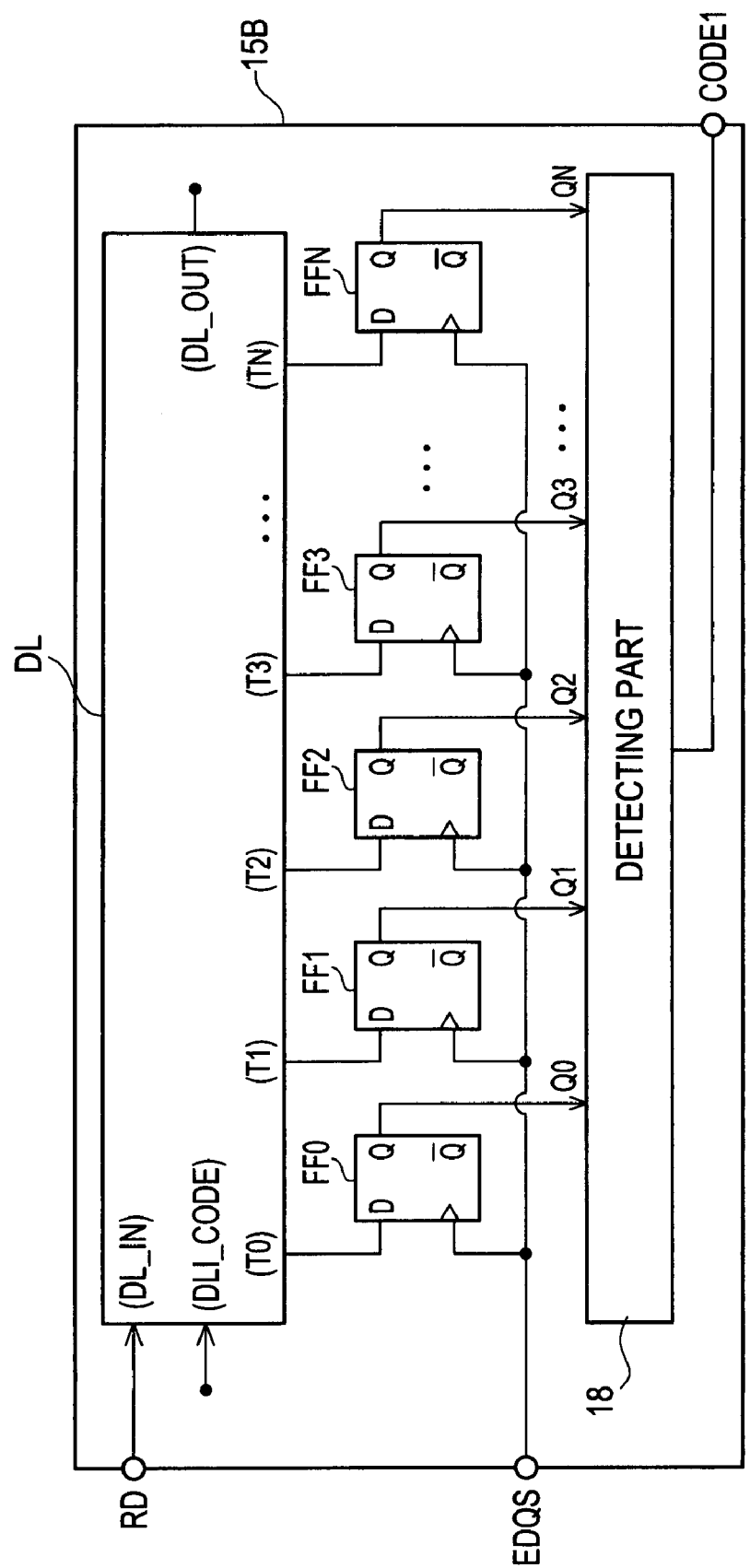
FIG. 10  DIAGRAM OF RL MEASURING PART APPLIED TO SECOND SPECIFIC EXAMPLE OF THIRD EMBODIMENT

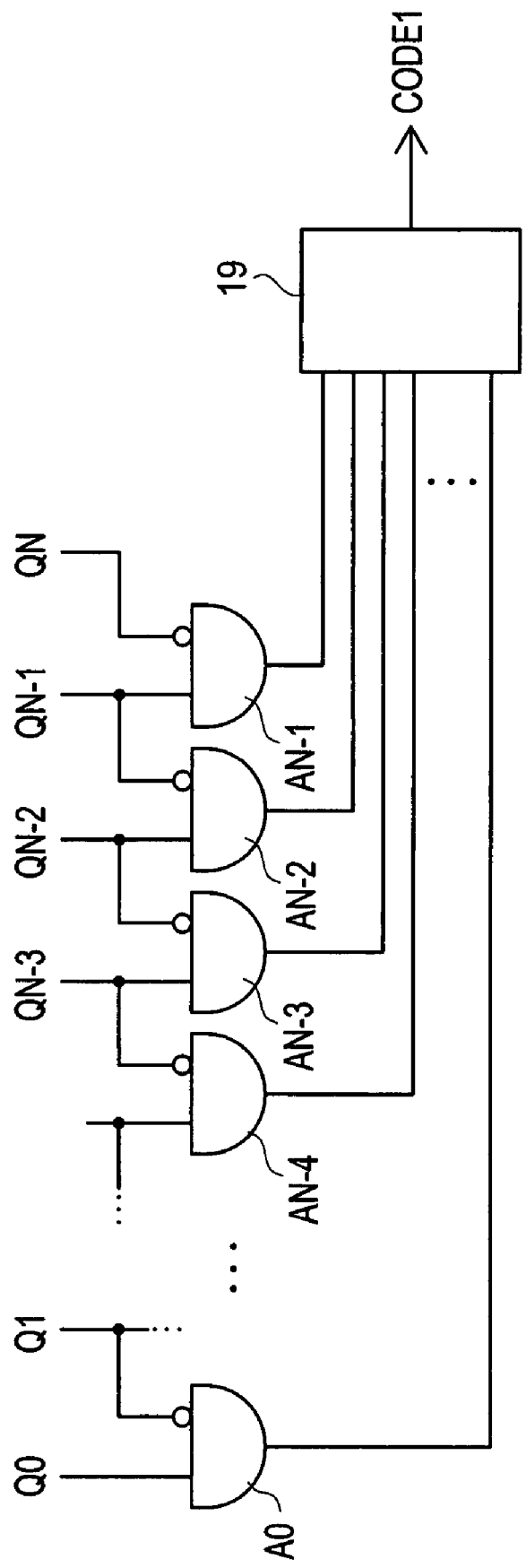
FIG. 11  SPECIFIC EXAMPLE OF DETECTING PART 18 SHOWN IN FIG. 10

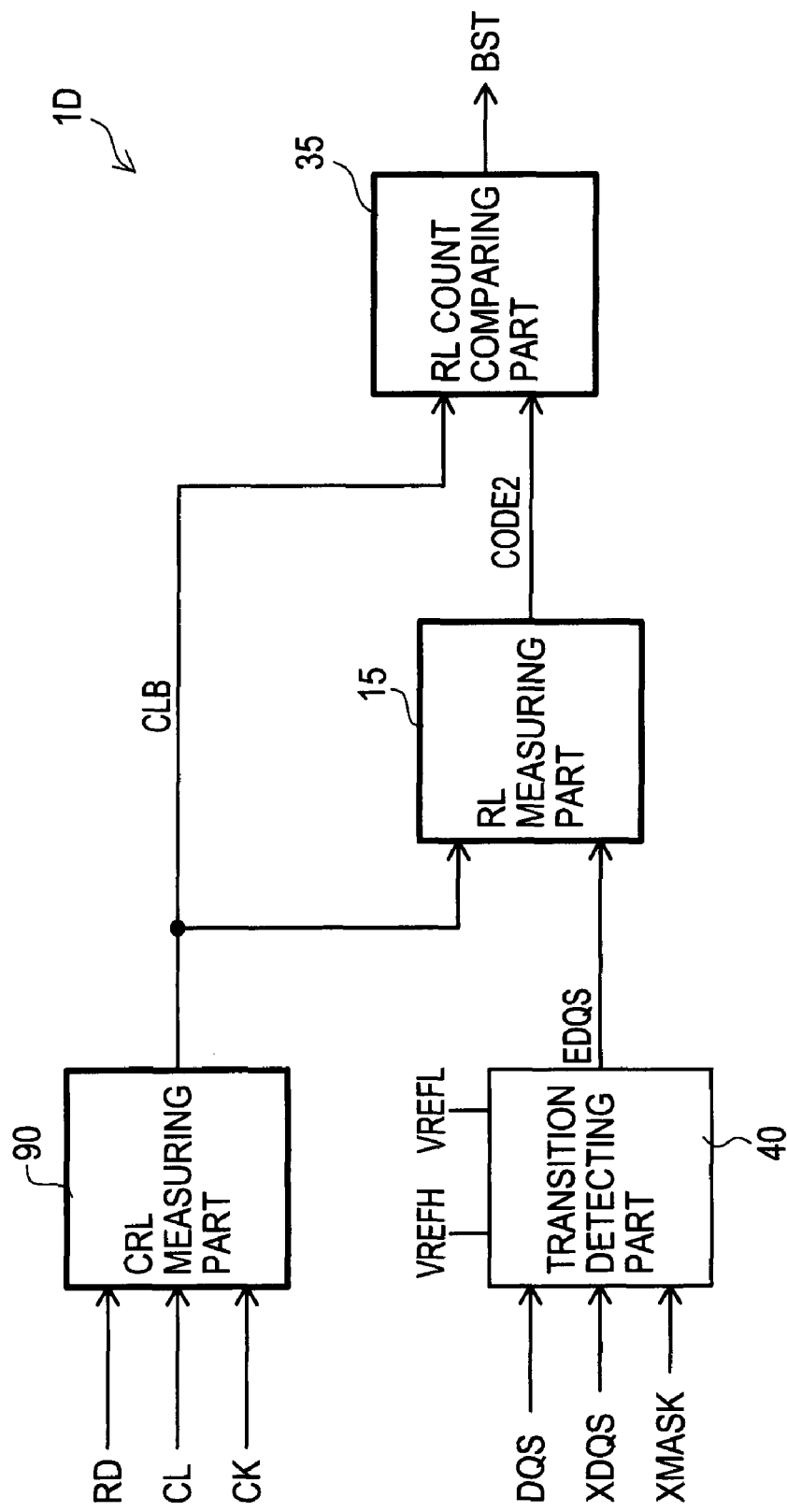
FIG. 12  DIAGRAM SHOWING STRUCTURE OF DATA FETCH CIRCUIT ACCORDING TO THIRD EMBODIMENT FIG. 13   BLOCK DIAGRAM SHOWING STRUCTURE OF DATA FETCH CIRCUIT ACCORDING TO FIFTH EMBODIMENT
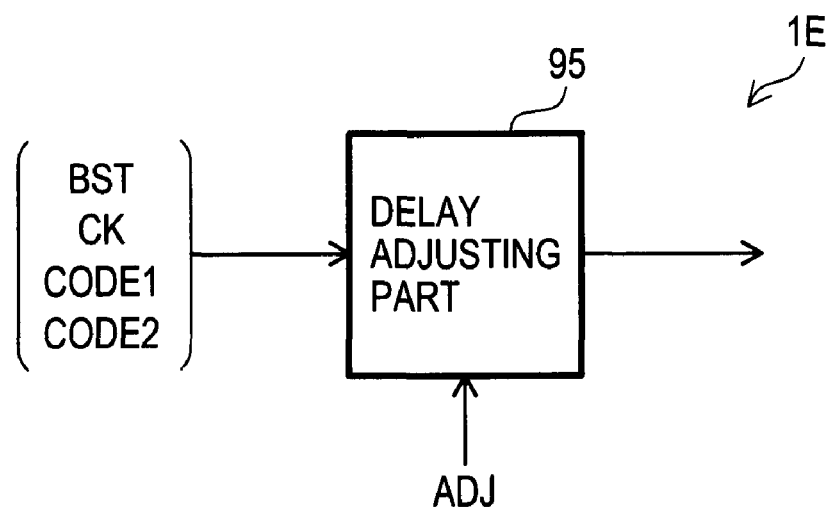

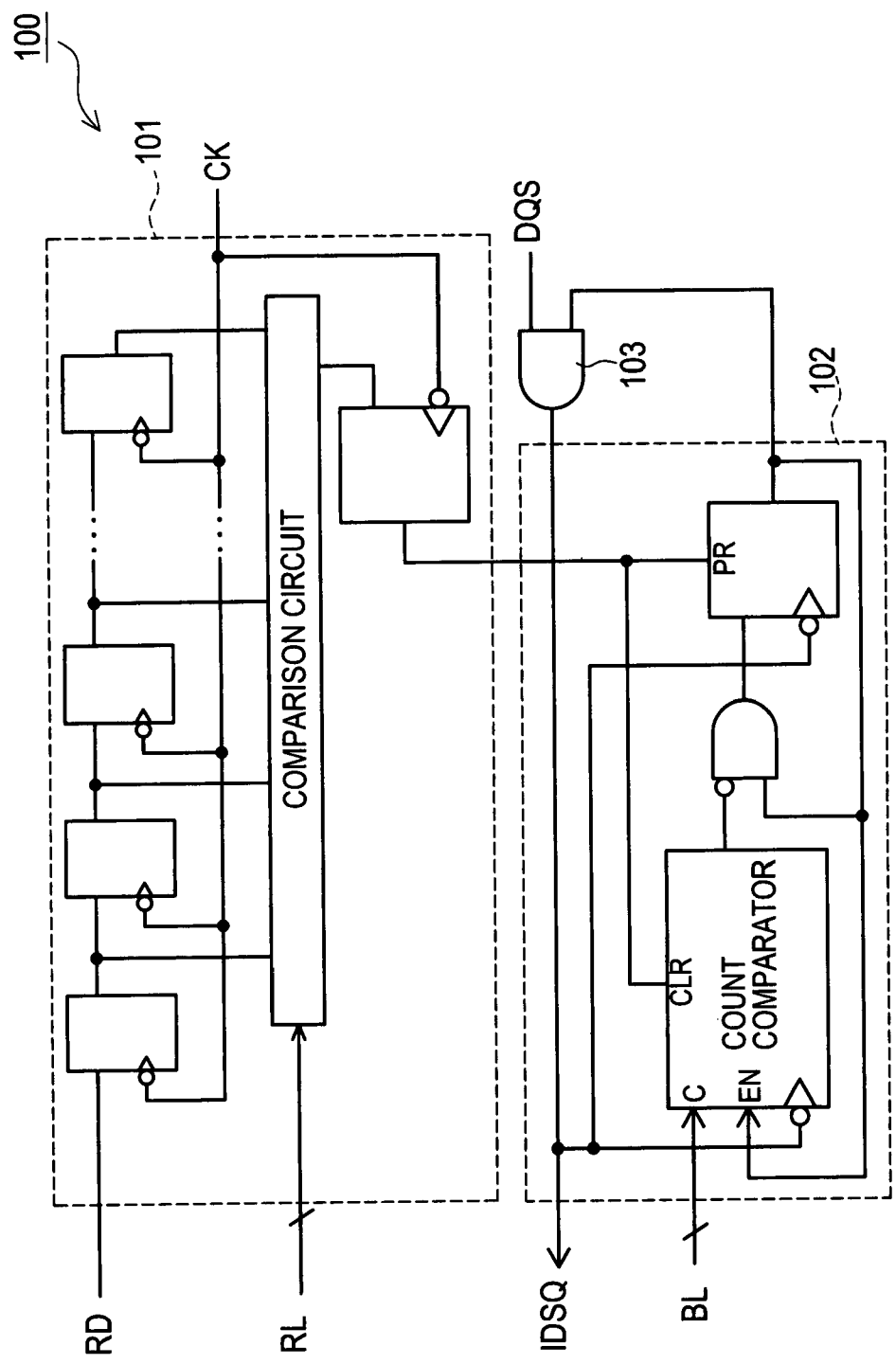
FIG. 14 (PRIOR ART) BLOCK DIAGRAM SHOWING STRUCTURE OF CONVENTIONAL DATA FETCH CIRCUIT

APPARATUS AND METHOD FOR MASKING INPUT OF INVALID DATA STROBE SIGNAL

CROSS-REFERENCE TO RELATED APPLICATIONS

This application is a continuation-in-part of the U.S. patent application Ser. No. 11/445,144, filed Jun. 2, 2006, [now abandoned] and claims the benefit of priority from Japanese Patent Application No. 2007-048022 filed on Feb. 27, 2007 and Japanese Patent Application No. 2006-052909 filed on Feb. 28, 2006. The entire contents of these applications are incorporated herein by reference.

BACKGROUND

1. Field

The field of the embodiment relates to a technology for eliminating a high impedance state from a data strobe signal DQS outputted synchronously with a data signal DQ in a DDR SDRAM, and for generating a strobe signal for fetching the data signal DQ.

2. Description of the Related Art

In read-operation of the DDR SDRAM (Double Data Rate Synchronous Dynamic Random Access Memory), data is outputted to a memory bus from the SDRAM synchronously with an edge of the data strobe signal DQS. At this time, the data strobe signal DQS having three values makes a transition from the high impedance state to a low level or high level. Meanwhile, a device for reading data fetches the data outputted to the memory bus synchronously with the edge of the data strobe signal DQS. Further, when the data is actually fetched by the device, an internal data strobe signal is used that the high impedance of the data strobe signal is masked from the data strobe signal. The level of the data strobe signal in the high impedance state becomes unstable and therefore a noise is easily mixed to the data strobe signal. That is why there is a risk that an erroneous fetch arises when the data strobe signal in such a state is used for a clock of data fetch.

An SDRAM interface circuit 100 shown in FIG. 14 is used as a technology for masking the high impedance state from the data strobe signal DQS.

The SDRAM interface circuit 100 includes: an RL count comparing part 101 to which a read instruction signal RD, a standby clock number RL and a clock signal CK are inputted and which outputs a BL count start signal BST; a BL count comparing part 102 to which the BL count start signal BST, a burst length BL and a fetch data strobe signal IDQS is inputted and which outputs a mask signal XMASK; and an AND gate 103 to which the mask signal XMASK and the data strobe signal DQS is inputted and which outputs the fetch data strobe signal IDQS.

The RL count comparing part 101 starts counting the clock signals CK when the read instruction signal RD is inputted thereto, and outputs the BL count start signal BST when the count value reaches the standby clock number RL. Here, a value of the standby clock number RL is set in advance.

When the BL count start signal BST is inputted to the BL count comparing part 102, the BL count comparing part 102 makes the mask signal XMASK active, starts counting the fetch data strobe signal IDQS and holds an active state of the mask signal XMASK until the count value reaches the burst length BL.

According to the above-described constitution, the SDRAM interface 100 starts counting the clock signals CK when the read instruction signal RD is inputted thereto, and makes the mask signal XMASK active by the number of clocks of the burst length BL when the count value reaches the standby clock number RL. The standby clock number RL is set in advance so that the data strobe signal DQS exceeds a period of the high impedance state. The high impedance of the data strobe signal DQS is thus masked, so an input of the data at the high impedance state to the fetch clock can be prevented.

Moreover, an art related to an SDRAM interface circuit is disclosed in Japanese unexamined patent publication No. 2003-85974.

SUMMARY

It is an aspect of the embodiments discussed herein to provide a data fetch circuit, which reliably cuts off transmission of the high impedance state of the data strobe signal even if the manufacture condition or the operation condition is changed, and a control method thereof.

BRIEF DESCRIPTION OF THE DRAWINGS

FIG. 1 is a block diagram showing an inventive data fetch system;

FIG. 2 is a block diagram showing the structure of a data fetch circuit according to a first embodiment;

FIG. 3 is a circuit diagram showing a specific example of the data fetch circuit;

FIG. 4 is a circuit diagram showing an example of a transition detecting part;

FIG. 5 is a timing chart showing operation of the data fetch circuit according to the first embodiment;

FIG. 6 is a block diagram showing the structure of a data fetch circuit according to a second embodiment;

FIG. 7 is a block diagram showing the structure of a data fetch circuit according to a third embodiment;

FIG. 8 is a diagram of an RL count comparing part according to the third embodiment;

FIG. 9 is a diagram of an RL measuring part applied to a first specific example of the third embodiment;

FIG. 10 is a diagram of an RL measuring part applied to a second specific example of the third embodiment;

FIG. 11 is a specific example of a detecting part 18 shown in FIG. 10;

FIG. 12 is a block diagram showing the structure of a data fetch circuit according to a fourth embodiment;

FIG. 13 is a block diagram showing the structure of a data fetch circuit according to a fifth embodiment; and FIG. 14 is a block diagram showing the structure of a data fetch circuit of a prior art.

DETAILED DESCRIPTION OF THE PREFERRED EMBODIMENTS

According to the SDRAM interface circuit 100 shown in FIG. 14, however, when a manufacture condition such as a process unevenness or an operation condition such as temperature or voltage is changed and a delay time between an SDRAM and an SDRAM interface circuit 100 becomes large, there arises a risk that a high impedance state of a data strobe signal DQS exceeds a period of a standby clock number RL. In such a case, a mask period of the high impedance of the data strobe signal DQS becomes insufficient, so there arises a problem that the high impedance is inputted to a fetch clock of the data.

The above and further objects and novel features of the embodiment will more fully appear from the following detailed description when the same is read in connection with the accompanying drawing it is to be understood, however, that the drawings are form the purpose of illustration only and are not intended as a definition of the limits of an invention.

In the data fetch circuit of the present embodiment, a response time from an input of a read instruction signal to a valid edge of the data strobe signal is measured, and the response time is set to a time of standby (also referred to as standby time hereinafter) of a standby part. That is, even if the manufacture condition such as a process or the operation condition such as time or voltage is changed and the delay time of the read instruction signal becomes uneven, the standby time is set based on the measured response time. Thus, the data fetch circuit can be realized which is capable of reliably masking the transmission of the high impedance of the data strobe signal without an impact on the manufacture condition or the operation condition.

Hereinafter, embodiments which effectuate a data fetch circuit, data fetch system and control method of the data fetch circuit for carrying out the present embodiment will be described in detail with reference to FIG. 1 to FIG. 5.

FIG. 1 is a circuit block diagram of a data fetch system to which the present embodiment is applied. The system comprises a synchronous dynamic random access memory (abbreviated as SDRAM, hereinafter) (R) and a controller (C) for controlling the SDRAM (R). A system clock signal SCK is supplied to each of the SDRAM (R) and the controller (C) whereby they operate synchronously.

A data read command signal CMD issued from the controller (C) is inputted to a data fetch circuit 1 provided in the controller (C) and transmitted to the SDRAM (R) through an external bus. This transmission time corresponds to a first flight time FT (1). That is, a transmission time for a data read command signal CMD issued from the controller (C) to go through the external bus is expressed with the number of clocks of the system clock signal SCK.

An operation to read a data signal DQ is carried out on condition that the data read command signal CMD which has reached the SDRAM (R) is decoded there. It is to be noted that CAS latency CL corresponds to a time for a data signal DQ to be read from a memory cell (not shown) in the SDRAM (R). That is, an access time from an input of a data read command signal CMD to an output of a data signal DQ is expressed with the number of clocks of the system clock signal SCK. Upon receipt of the data read command signal CMD, the SDRAM (R) allows signal level of a data strobe signal DQS to make a transition from a high impedance state to a low level. After that, the SDRAM (R) allows signal level of the data strobe signal DQS to make a transition from a low level to a high level in synchronous with an output of a data signal DQ. In the SDRAM (R), timing for a data strobe signal DQS make a transition from a high impedance state to a low level is defined as a time going back by a read preamble time (tRPRE) from a lapse of CAS latency CL. It corresponds to a one-cycle advanced timing, for example.

Both the data strobe signals DQS, XDQS and the data signal DQ are transmitted to the controller (C). It is to be noted that the data strobe signal DQS and the data strobe signal XDQS are complementary to each other. This transmission time corresponds to a second flight time FT(2). That is, a transmission time for a data strobe signals DQS, XDQS and a data signal DQ all of which are outputted from the SDRAM (R) to go through the external bus is expressed with the number of clocks of the system clock signal SCK.

The data fetch circuit 1 detects the data strobe signals DQS, XDQS make a sequential transition from a high impedance state to a low level and a high level as a valid edge. By measuring a time issued from the read command signal RD in response to the data read command signal CMD, the data signal DQ transmitted from the SDRAM (R) can be fetched reliably.

FIG. 2 is a block diagram showing the structure of a data fetch circuit 1A for fetching a data signal DQ from the SDRAM according to a first embodiment. The data fetch circuit 1A is a part of a circuit for fetching a data signal DQ outputted synchronously with a data strobe signal DQS taking a three state condition, and is a circuit for generating a fetch data strobe signal IDQS that a high impedance state of the data strobe signal DQS is eliminated.

The data fetch circuit 1A includes: an RL measuring part 10 to which a read instruction signal RD, an internal data strobe signal EDQS to be described later and a clock signal CK are inputted and which outputs a latency measurement value RLB; and a delay part 20 to which the read instruction signal RD is inputted and which outputs a delay read instruction signal RDD.

Further, the data fetch circuit 1A includes: an RL count comparing part 30 to which the delay read instruction signal RDD, the latency measurement value RLB and the clock signal CK are inputted and which outputs a BL count start signal BST; and a transition detecting part 40 to which the data strobe signal DQS, an inversion data strobe signal XDQS complementary to the data strobe signal DQS and an inversion mask signal XMASK are inputted and which outputs an internal data strobe signal EDQS.

Furthermore, the data fetch circuit 1A includes: a BL count comparing part 50 to which the BL count start signal BST, a burst length BL and the fetch data strobe signal IDQS are inputted and which outputs the inversion mask signal XMASK; and a gate circuit 60 to which the inversion mask signal XMASK and the data strobe signal DQS are inputted and which outputs the fetch data strobe signal IDQS.

FIG. 3 is a circuit diagram showing a specific example of the data fetch circuit 1A. The RL measuring part 10 includes flip-flops 11A to 11H of which inversion clock terminals are respectively connected to the clock signal CK and flip-flops 12A to 12H of which clock terminals are respectively connected to the internal data strobe signal EDQS. The flip-flops 11A to 11H constitute a shift register of which a serial input terminal is a data input terminal of the flip-flop 11A. Additionally, the flip-flops 12A to 12H constitute a register for holding latency count values RLA 0 to 7, as the respective outputs of the flip-flops 11A to 11H, in accordance with the internal data strobe signal EDQS. Each output terminal of the flip-flops 12A to 12H is connected to the RL count comparing part 30 as the latency measurement values RLB 0 to 7.

The delay part 20 is constituted by a flip-flop of which an inversion clock terminal is connected to the clock signal CK and a data input terminal is connected to the read instruction signal RD. Thus, in the delay part 20, the read instruction signal RD is delayed by one period of the clock signal CK and outputted as the delay read instruction signal RDD.

The RL count comparing part 30 includes: flip-flops 31A to 31H that the clock signal CK is connected to each of inversion clock terminals thereof; and a comparison circuit 32 for selecting any of RL count values RLC 0 to 7 outputted from the flip-flops 31A to 31H in accordance with the latency measurement values RLB 0 to 7. The flip-flops 31A to 31H constitute a shift register of which a serial input terminal is a data input terminal of the flip-flop 31A. When the delay read instruction signal RDD is inputted to the data input terminal of the flip-flop 31A, the RL count values RLC are shifted up in order. When the RL count value RLC reaches the latency measurement value RLB, the BL count start signal BST makes a transition to a high level.

The transition detecting part 40 compares the data strobe signal DQS and the inversion data strobe signal XDQS, which are complementary to each other, with a high level threshold voltage VREFH and a low level threshold voltage VREFL. Thus, a transition of the data strobe signal DQS from the high impedance to a low level is detected, and the internal data strobe signal EDQS is outputted.

FIG. 4 is a circuit diagram showing an example of the transition detecting part 40. The transition detecting part 40 includes a first comparator 41, a second comparator 42 and gate circuits 43 and 44. In the first comparator 41, a non-inversion input terminal is connected to the low level threshold voltage VREFL, an inversion input terminal is connected to the data strobe signal DQS and an output terminal is connected to an input terminal of the gate circuit 43, respectively. In the second comparator 42, a non-inversion input terminal is connected to the inversion data strobe signal XDQS, an inversion input terminal is connected to the high level threshold voltage VREFH and an output terminal is connected to another input terminal of the gate circuit 43. In the gate circuit 44, an input terminal is connected to an output terminal of the gate circuit 43, another negative logic input terminal is connected to the inversion mask signal XMASK and an output terminal is connected to the internal data strobe signal EDQS.

The level of the data strobe signal DQS is complementary to that of the inversion data strobe signal XDQS. That is, the level of the inversion data strobe signal XDQS is low when the level of the data strobe signal DQS is high, and the level of the inversion data strobe signal XDQS is high when the level of the data strobe signal DQS is low. However, both the data strobe signal DQS and the inversion data strobe signal XDQS become the high impedance state, the signals are respectively set to middle voltages between high level and low level by a termination resistor (not shown) connected to the outside. Since the termination resistor functions to either signal in the same way, the respective signals take an approximate same potential in the case of being in the high impedance state.

Additionally, the high level threshold voltage VREFH is a threshold voltage for detecting a high level, and the low level threshold voltage VREFL is a threshold voltage for detecting a low level, to the data strobe signal DQS and the inversion data strobe signal XDQS.

When the level of the data strobe signal DQS is low and the level of the inversion data strobe signal XDQS is high, the first comparator 41 outputs a high level since the voltage of the data strobe signal DQS is lower than the low level threshold voltage VREFL, and the second comparator 42 outputs a high level since the voltage of the inversion data strobe signal XDQS is higher than the high level threshold voltage VREFH. Thus, the gate circuit 43 outputs a high level.

Next, when the level of the data strobe signal DQS is high or the level of the inversion data strobe signal XDQS is low, the first comparator 41 outputs a low level since the voltage of the data strobe signal DQS is higher than the low level threshold voltage VREFL, or the second comparator 42 outputs a low level since the voltage of the inversion data strobe signal XDQS is lower than the high level threshold voltage VREFH. Thus, the gate circuit 43 outputs a low level.

Finally, when both the data strobe signal DQS and the inversion data strobe signal XDQS are in the high impedance state, at least either of the first comparator 41 or the second comparator 42 outputs the low level since each potential of the signals becomes the same. Thus, the gate circuit 43 outputs the low level.

Thus, since the gate circuit 43 outputs the low level when the data strobe signal DQS is in the high impedance state and the level thereof is low, the low level is outputted to the internal data strobe signal EDQS. Additionally, since the gate circuit 43 outputs the high level when the level of the data strobe signal DQS is high, the high level is outputted to the internal data strobe signal EDQS for the period when the level of the inversion mask signal XMASK is low.

The BL count comparing part 50 will be described with reference to FIG. 3. The BL count comparing part 50 includes: a count comparator 51 in which the burst length BL is connected to a comparison input terminal C, the inversion mask signal XMASK is connected to a count enable terminal EN, and the fetch data strobe signal IDQS is connected to an inversion clock terminal; a gate circuit 52 in which an output of the count comparator 51 is connected to an inversion side input terminal, and the inversion mask signal XMASK is connected to a non-inversion side input terminal; and a flip-flop 53 of which a data input terminal is connected to an output of the gate circuit 52 and an inversion clock terminal is connected to the fetch data strobe signal IDQS. Here, the data strobe signal IDQS is a signal that a gate circuit 60 takes an AND operation of the inversion mask signal XMASK and the data strobe signal DQS.

Moreover, the BL count start signal BST is connected to a clear terminal CLR of the count comparator 51 and a preset terminal PR of the flip-flop 53. Thus, when the level of the BL count start signal BST becomes high, the count comparator 51 is reset, the flip-flop 53 is preset, and the BL count comparator 50 is initialized.

The BL count comparator 50 outputs a high level to the inversion mask signal XMASK when initialized, and makes a count value of the count comparator 51 zero. Further, the count comparator 51 counts every falling edge of the fetch data strobe signal IDQS, and outputs a high level when the count value reaches the burst length BL. Then, a low level is outputted to the output of the gate circuit 52. Furthermore, the inversion mask signal XMASK, which is an output of the flip-flop 53, makes a transition to a low level in the falling edge of the fetch data strobe signal IDQS.

Next, operation of the data fetch circuit 1A will be described. FIG. 5 is a timing chart showing the operation of the data fetch circuit 1A according to the first embodiment.

Here, the clock signal CK is a clock signal of the data fetch circuit 1A having a double frequency of that of the system clock signal SCK. A data read command signal CMD is a signal that a controller (C) (see FIG. 1) instructs the SDRAM (R) (see FIG. 1) to operate. That is, the data read command signal CMD is issued from the controller (C) to the SDRAM (R). In FIG. 5, "CMD (controller)" indicates an output from the controller (C) and "CMD (SDRAM)" indicates an input to the SDRAM(R). Additionally, "(COUNT VALUE IN 51)" indicates a count value of the inside of count comparator 51. The other symbols are symbols based on the signal names shown in FIG. 3 respectively.

Additionally, in FIG. 5, "FT(1)" and "FT(2)" indicate a first flight time and second fight time, respectively, and "CL" indicates a CAS latency CL. In the present embodiment, both the flight time FT(1) and the flight time FT(2) are equal to 1.5 and the CAS latency CL is equal to 2.

The data read command signal CMD issued from the controller (C) reaches the SDRAM (R) at the first flight time FT(1). When it is assumed that a read preamble time (tRPRE) of the SDRAM (R) is one cycle of a system clock signal SCK, in the SDRAM (R), the number of clocks to be taken from a receipt of a data readout command signal CMD to a valid edge at which a data strobe signal DQS makes a transition from a high impedance to a low level is "1", a subtraction of "2", the value of the CAS latency, minus "1". Furthermore, the data strobe signal DQS which has made the transition to a low level in the SDRAM (R) reaches the controller (C) at the second flight time FT(2). That is, the latency RL is equal to 4.0 which is the number of clocks from the issuance of a data read command signal CMD of by the controller (C) (transition of the read instruction signal RD to a high level) to a valid edge TRL of the data strobe signal DQS. That is, a response time TRL from an input of the read instruction signal RD to the valid edge of the data strobe signal DQS is represented by a period of 4.0× the system clock signal SCK.

In (1) of FIG. 5, when "Read" is issued as the data read command signal CMD and the read instruction signal RD makes the transition to a high level, the RL measuring part 10 starts counting the latency count values RLA. Also in (2), the RL measuring part 10 starts counting the RL count values RLC after delay by a transition time of a delay part 20, that is, one cycle of the clock signal CK. Both the count values of the latency count value RLA and the RL count value RLC are counted by the shift register, thereby taking values shifted bit by bit from the least significant bit. That is, 01, 02, 04, 08, 10, 20, 40 and 80 is outputted in this order by an octal number in either count value.

In (3), when the data strobe signal DQS makes the transition from the high impedance to the low level, the transition detecting part 40 detects the state transition and outputs a high level to the internal data strobe signal EDQS. When the internal data strobe signal EDQS makes a transition to the high level, the RL measuring part 10 holds the value of the latency count value RLA and outputs 20 to the latency measurement value RLB. The value of the latency measurement value RLB is a value corresponding to a response time TRL from the input of the read instruction signal RD to the transition of the data strobe signal DQS from the high impedance to the low level.

In (4), when the output value 20 of the latency measurement value RLB corresponds to an output value 20 of the RL count value RLC, the RL count comparing part 30 outputs a high level to the BL count start signal BST only for a period when the value of the RL count value RLC is 20. Moreover, the RL count comparing part 30 starts counting with advance delay by one cycle of the clock signal CK which corresponds to a delay time of the delay part 20. That is, the RL count value RLC is delayed by one cycle of the clock signal CK in comparison with the latency count value RLA, whereby the BL count start signal BST is outputted form a next cycle of the response time TRL.

And then, when the BL count start signal BST makes the transition to the high level, the count value of the count comparator 51 is initialized as zero and a high level is outputted from the BL count comparing part 50 to the inversion mask signal XMASK. When the inversion mask signal XMASK makes the transition to the high level, the level of the data strobe signal DQS is transmitted via the gate circuit 60 and a strobe signal is outputted to the fetch data strobe signal IDQS.

In (5), when the count value of the count comparator 51 reaches the value set to the burst length BL (when the burst length=2, BL=1), a low level is outputted to the inversion mask signal XMASK by fall of the fetch data strobe signal IDQS. Thus, the gate circuit 60 cuts off the subsequent data strobe signals DQS.

Moreover, when a data read command signal CMD of Read is further issued to the SDRAM (R) with Read-operation to the data read command signal CMD not completed, the Burst READ Interrupt by READ mode is performed. In this case, the data strobe signal DQS outputs a data strobe signal DQS to the second data read command signal CMD without making the transition to the high impedance. The RL count comparing part 30 starts counting the RL count values RLC from a point of time when a read instruction signal RD is issued to the second data read command signal CMD, and outputs a BL count start signal BST again at a point of time when the count value reaches 20. Thus, a latency to the second read instruction signal RD, 4.0, is reflected on the inversion mask signal XMASK, and cut-off control of the data strobe signal DQS is accurately performed along an output timing of the strobe signal of the data strobe signal DQS.

In the data fetch circuit 1A according to the first embodiment, the latency measurement value RLB in which the time from the input of the read instruction signal RD to the internal data strobe signal EDQS is measured is set as a response time TRL in the RL count comparing part 30. Thus, even if the flight time FT(1) and the flight time FT(2) are changed due to a difference in wiring length and wiring load of external bus to connect the controller (C) and SDRAM (R), and or a change of a manufacture condition such as a process unevenness and an operation condition such as temperature or voltage are changed, the latency is adjusted in accordance with the change and the cut-off control of the data strobe signal can be performed. Accordingly, the data fetch circuit 1A can reliably cut off the transmission at the high impedance state without an impact of the change of the flight time FT(1) and the flight time FT(2).

Moreover, the shift part 20A described below for shifting the latency measurement value RLB left and outputting a latency measurement value RLB2 may be provided in place of the delay part 20. Although the flip-flops 31A to 31H are shifted at the same timing as the flip-flops 11A to 11H, the latency measurement value RLB2 is shifted left, therefore the BL count start signal BST can be outputted at the same timing as the case where the delay part 20 is used.

Additionally, when the number of shift bits of the shift part 20A is fixed, a connection of the latency measurement value RLB from the RL measuring part 10 to RL count comparing part 30 is sufficient as long as allowing an arrangement of the bits to shift. Thus, a circuit structure more simple than the case where the delay part 20 is used can be obtained. Additionally, such a simple structure can be achieved even in a case where the delay time of the latency measurement value RLB is changed by using a barrel shifter, etc., for the shift part 20A.

Next, a data fetch circuit 1B according to a second embodiment will be described. FIG. 6 is a block diagram showing the structure of the data fetch circuit 1B. The data fetch circuit 1B is different from the data fetch circuit 1A according to the first embodiment that the data fetch circuit 1B includes a gate circuit 80 to which a measurement instruction signal RLE and the clock signal CK are inputted and which outputs to the clock terminal of the RL measuring part 10, and is the same as the data fetch circuit 1A regarding the other components. Accordingly, the different part from the data fetch circuit 1A according to the first embodiment will be mainly described, and descriptions of the other parts will be simplified or omitted.

A first data strobe signal DQSL indicating a first rising edge after the transition of the data strobe signal DQS from the high impedance to the low level is inputted to the RL measuring part 10. Moreover, the first data strobe signal DQS1 can be generated in such a way that the data fetch circuit 1A includes the transition detecting part 40 similarly to the SDRAM interface circuit 1 according to the first embodiment and delays detecting the transition of the data strobe signal DQS from the high impedance to the low level.

The gate circuit 80 calculates an AND operation of the measurement instruction signal RLE which is inputted to an input terminal of the gate circuit 80 and the clock signal CK which is inputted to the other input terminal thereof, and outputs the results to the clock terminal of the RL measuring part 10. Thus, in the RL measuring part 10, the latency measurement value RLB is updated only for a period that the level of the measurement instruction signal RLE is high. Operation after the setting of the latency measurement value RLB is similar to that of the data fetch circuit 1A of the first embodiment.

Here, it is possible that the measurement instruction signal RLE is controlled so as to make a transition to the high level for a specific period, for example, at a power-on time or an initial setting of a system so that a count or update operation for obtaining the latency measurement value RLB, etc., is not performed for every transition of the data strobe signal DQS from the high impedance to the low level. Thus, operation power consumed for the count or update operation for obtaining the latency measurement value RLB can be reduced, and further consumption power of the entire data fetch circuit 1B can be reduced.

Next, a data fetch circuit 1C according to a third embodiment will be described. The data fetch circuit 1C measures a time by making use of a delay line while the data fetch circuits 1A and 1B (first and second embodiments) measure time by counting clock signals CK. Thereby, measurement accuracy is intended.

FIG. 7 is a block diagram showing the structure of the data fetch circuit 1C. The data fetch circuit 1C is different from the data fetch circuit 1A according to the first embodiment that the data fetch circuit 1C includes an RL measuring part 15 and an RL count comparing part 35, instead of the RL measuring part 10 and the RL count comparing part 30 directed to the data fetch circuit 1A. Additionally, different from the data fetch circuit 1A, the data fetch circuit 1C does not include the delay part 20 and the shift part 20A, but is the same as the data fetch circuit 1A regarding the other components. Accordingly, the different part from the data fetch circuit 1A according to the first embodiment will be mainly described, and descriptions of the other parts will be simplified or omitted.

The RL measuring part 15 measures a time from an input of a read instruction signal RD to an output of an internal data strobe signal EDQS with the aid of delay line while inputting the read instruction signal RD and the internal data strobe signal EDQS. As a measured time, the RL measuring part 15 outputs a code signal CODE1 for setting a delay time at a delay line. The RL count comparing part 35 includes a delay line, measures a time measured by the RL measuring part 15 as a standby time depending on an inputted code signal CODE1, and outputs a BL count start signal BST.

It is also possible to carry out measurement operation restricted to at the time of power on or initial setting of system by controlling the RL measuring part 15 in accordance with a measurement instruction signal RLE. Once obtaining and holding a code signal CODE1 of a measurement time at the time of initialization, a delay line of the RL count comparing part 35 can be set in accordance with the held code signal CODE1. In that case, it also is possible to design in such a manner that a measurement end signal END is outputted when measurement operation by the RL measuring part 15 is terminated and the code signal CODE1 is acquired. Acquisition of the code signal CODE1 can be notified.

FIG. 8 is a specific example of the RL count comparing part 35 which is structured with a delay line DL. In the drawing, the read instruction signal RD is inputted to a delay line input terminal (DL_IN) and the code signal CODE1 is inputted to a code input terminal (DLI_CODE). The BL count start signal BST is outputted from a delay line output terminal (DL_OUT).

The delay line DL comprises delay units DU0 through DUN connected in series from the delay line input terminal (DL_IN) with multi-stage manner. Each of the delay units DU0 through DUN is connected to a next-stage delay unit through first logic inversion circuit such as inverter gate, and includes output taps (T0) through (TN) through a second logic inversion circuit. Each of the output taps (T0) through (TN) is inputted to a selecting part DLS. At the selecting part DLS, one of the output taps (T0) through (TN) is selected depending on the code signal CODE1 inputted from the code input terminal (DLI_CODE), and connected to the delay line output terminal (DL_OUT).

An RL measuring part 15A shown in FIG. 9 is a first specific example of the RL measuring part 15 according to the third embodiment. In the first specific example, by sequentially changing a delay time of the delay line DL with sequential changing of a code signal CODE1, a time from a read instruction signal RD to an internal data strobe signal EDSQ is measured.

The RL measuring part 15A comprises a delay line DL structurally same as the delay line DL provided in the RL count comparing part 35 and a measurement judging part 17. The read instruction signal RD is inputted to the delay line input terminal (DL_IN) and the delay signal RD1 outputted from the delay line output terminal (DL_OUT) is inputted to the measurement judging part 17. From the measurement judging part 17, the code signal CODE1 which changes sequentially is inputted to the code input terminal (DLI_CODE). To the measurement judging part 17, a measurement instruction signal RLE and an internal data strobe signal EDQS are inputted.

At the measurement judging part 17, the code signal CODE1 is initialized in response to an input of the measurement instruction signal RLE (S1). After the initialized code signal CODE1 is transmitted to the delay line DL and a delay time of the delay line is initialized, the read instruction signal RD makes a transition to a high level. From the delay line DL, the delay signal RD1 makes a transition to a high level by a time of initialization. In accordance with the transition of the delay signal RD1, a logic level value of the internal data strobe signal EDQS is detected (S2). In case the logic level value of the internal data strobe signal EDQS is a low level (S2: NO), it is detected that data strobe signal DQS is still in a high impedance state. Incrementing the code signal CODE1 by "1" (S3), the processing goes on to (S2) to input a read instruction signal RD again. In case the logic level value of the internal data strobe signal EDQS is a high level (S2: YES), the code signal CODE1 is outputted while the value set for the code signal CODE1 is held (S4). At the same time, the measurement end signal END is outputted.

A time from a read instruction signal RD to an internal data strobe signal EDQS can be measured based on a delay time per a delay unit of the delay line DL. Since the time thus measured is held at the measurement judging part 17 as a code signal CODE1, the delay line provided in the RL count comparing part 35 is set depending on the code signal CODE1 held and a standby time can be measured with preferable accuracy.

An RL measuring part 15B shown in FIG. 10 is a second specific example of the RL measuring part 15 according to the third embodiment. In the second specific example, there is acquired a signal outputted to each of the output taps (T0) through (TN) of the delay line DL where the read instruction signal RD goes through in accordance with a high level transition of the internal data strobe signal EDQS. By detecting a point where the accrued signal makes a logic level transition from a low level to a high level, a time from a read instruction signal RD to a internal data strobe signal EDQS is measured.

The RL measuring part 15B comprises a delay line DL structurally same as the delay line DL provided in the RL count comparing part 35, flip-flops FF0 through FFN to which input terminals (D) are connected to respective output taps (T0) through (TN) of the delay line DL, and a detecting part 18 to which output signals Q0 through QN outputted from output terminals (Q) of the respective flip-flops FF0 through FFN are inputted. The flip-flops FF0 though FFN fetch signals outputted from the output taps (T0) through (TN) in a high level transition and output them as output signals Q0 thorough QN from the respective output terminals (Q).

When a high-level read instruction signal RD is inputted to the delay line input terminal (DL_IN) of the delay line DL, the high level signal goes through the delay units DU0 through DUN sequentially and the output taps (T0) through (TN) make a high level transition sequentially. At the detecting part 18, there are fetched output signals Q0 through QN directed to output taps (T0) through (TN), respectively, at a point in time that the internal data strobe signal EDQS makes a high level transition and logic level of those output signals are detected. That is, the high-level-and-low-level boundary of the output signals Q0 through QN is specified. The specified boundary position is decoded and outputted as a code signal CODE1.

FIG. 11 is a specific example of the detecting part 18. In the specific example, the detecting part 18 comprises AND gates A0 through AN-1. Among output signals Q0 through QN to be inputted to respective AND gates A0 through AN-1, signals outputted from a descendant-stage delay unit are inversed and then inputted. Thereby, a low-level-to-high-level transition point due to input of a read instruction signal RD can be detected. Signals detected and outputted from the AND gates A0 through AN-1 are decoded at the decoding part 19 and a code signals CODE1 are outputted.

With the RL measuring parts 15A and 15B according to the third embodiment, a time from a read instruction signal RD to an internal data strobe signal EDQS can be measured based on a delay time per delay unit of a delay line DL. The measured time is held as a code signal CODE1 in the measurement judging part 17 according to the first specific example. In the second specific example, the measured time can be held in the detecting part 18. A delay line DL to be provided in the RL count comparing part 35 is set depending on the thus held code signal CODE1, whereby a standby time can be measured with preferable accuracy.

Next, a data fetch circuit 1D according to a fourth embodiment will be described. In the fourth embodiment, measurement is carried out by combining: rough time measurement with the data fetch circuits 1A and 1B (first and second embodiment, respectively) in which clock signals CK are counted; and fine time measurement with the data fetch circuit 1C (third embodiment). That is, a simply structured circuit to count clock signals CK is used for measurement-accuracy-not-required rough measurement whereas high-accuracy-required time measurement is applied to the fine time measurement to be made after the rough time measurement by using a delay line. Thereby, high-accuracy time measurement can be made by using appropriate measurement method depending on required time measurement resolution.

FIG. 12 is a block diagram showing the structure of the data fetch circuit 1D. The data fetch circuit 1D further comprises a CL measuring part 90 in addition to composing elements same as the data fetch circuit 1C according to the third embodiment. The CL measuring part 90 inputs a read instruction signal RD, a CAS latency CL and a clock signal CK and outputs a CAS latency measurement value CLB. The RL measuring part 15 and the RL count comparing part 35 is structurally same as the ones in the data fetch circuit 1C according to the third embodiment, as to type of signal for input, a CAS latency measurement value CLB is inputted instead of a read instruction signal RD. Furthermore, instead of a code signal CODE1, a code signal CODE2 is used as a signal to be outputted from the RL measuring part 15 and inputted to the RL count comparing part 35.

The CL measuring part 90 starts count operation of clock signal CK in response to a high level transition of the read instruction signal RD. The count operation is made in the number of times equal to the number that "1" is subtracted from the CAS latency CL. In this case, the read preamble time (tRPRE) is regarded as one cycle of a clock signal CK. For the data fetch system (FIG. 1), a CAS latency CL is a time in which a data read command signal CMD reaches the SDRAM (R) through a first flight time FT(1) and data is outputted from the SDRAM (R) due to data read operation started the SDRAM (R). The SERAM (R) allows the data strobe signal DQS to make a transition from a high impedance state to a low level state with a timing one cycle advancing to the CAS latency CL. After that, a low-level transition of the data strobe signal DQS goes through the controller (C) at a second flight time FT(2). Since the time for the data strobe signal DQS to make the low-level transition in response to the receipt of a data read command signal CMD by the SDRAM (R) is previously determined as a time that "1" is subtracted from the CAS latency CL, the CL measuring part 90 measures the above determined time.

The delay line DL measures a time in which a CAS latency measurement value CLB outputted from the CL measuring part 90 is inputted to the RL measuring part 15 and an internal data strobe signal EDQS is outputted from the CAS latency measurement value CLB. The measured time is transmitted to the RL count comparing part 35 as a code signal CODE2. At the RL count comparing part 35, a delay time to be set based on the code signal CODE2 from the CAS latency measurement value CLB is measured as a standby time.

Among the time from the read instruction signal RD to the internal data strobe signal EDQS, the CAS latency measurement value CLB measurable with resolution along clock signal CK is measured by counting cycles of clock signal CK with the CL measuring part 90. The first flight time FT(1) and the second flight time FT(2) corresponding to a delay time for a signal to go between the controller (C) and the SDRAM (R) continuously change depending on load to be added to a external data bus. By measuring the continuously changeable time with the delay line DL, time measurement can be made with preferable accuracy. By summing up the above two times, a response time from a read instruction signal RD to an internal data strobe signal EDQS can be measured with the simply-structured circuit.

Next, a data fetch circuit 1E according to a fifth embodiment will be described. The data fetch circuit 1E shown in FIG. 13 comprises a delay adjusting part 95 which gives a delay time to: the BL count start signal BST used in the data fetch circuits 1A through 1D (first through third embodiments); the clock signal CK used in the data fetch circuits 1A, 1B and 1D (first, second and fourth embodiments); the code signal CODE1 used in the data fetch circuit 1C (third embodiment); and/or the code signal CODE2 used in the data fetch circuit 1D (fourth embodiment).

With a data fetch system in which a controller (C) and a SDRAM (R) are connected through an external bus, signal can possibly go through with a delay due to load on a signal path formed with a signal line or an external bus of the controller (C) and the SDRAM (RR) and/or a noise filter inserted in the external bus. Such delay times generally changes delay time for signals to go through depending on length of a signal path and peripheral environment of the signal path, or depending on a noise filter. The delay adjusting part 95 is provided to adjust the above mentioned delay times. It is preferable that the delay adjusting part 95 can adjust a delay time with an adjustment signal ADJ, whereby length of a delay time can be adjusted depending on system structure of a data fetch system.

Moreover, it is obvious that the present embodiment is not limited to the above-described embodiments and various improvements or modifications are applicable without departing from the spirit of the present embodiment.

For example, although the shift register used for the RL measuring part 10 and the RL count comparing part 30 is employed as a counter in the first and second embodiments, a normal binary counter may be employed as a counter.

Moreover, although the delay lines DL are provided with the RL measuring parts 15A and 15B separately from the delay line DL for the RL count comparing part 35 in the third and fourth embodiments, the present embodiment is not restricted to the cases of the third ad fourth embodiments. In case a time is measured with the RL measuring parts 15A and 15B, a delay line DL provided for the RL count comparing part 35 can be used.

Moreover, the RL measuring part 10 and the transition detecting part 40, the RL measuring part 15 and the transition detecting part 40, and the CL measuring part 90, the RL measuring part 15 and the transition detecting part 40 are examples of a response time measuring part. The RL count comparing part 30 and the RL count comparing part 35 are examples of the standby part, the read instruction signal RD, the delay read instruction signal RDD, and the CAS latency measurement value CLB are examples of the standby start signal, the RL measuring parts 10, 15, the CL measuring part 90 and the RL measuring part 15 are the examples of the measuring part, the delay part 20 or the shift part 20A is the example of the standby adjusting part. Additionally, the low level is an example of a first logic level, the high level is an example of a second logic level, the low level threshold voltage is an example of a first threshold voltage, and the high level threshold voltage is an example of a second threshold voltage. Additionally, the flip-flops 11A through 11H are the examples of the first counter part, the flip-flops 12A through 12H are the examples of the first holding part. Additionally, the measurement judging part 17, the flip-flops FF0 through FFN and the detecting part 18 are the examples of the selecting part. Additionally, the flip-flops FF0 through FFN are the examples of the delay line signal holding part. Additionally, the CL measuring part is the example of the first measuring part, and the RL measuring part 15 according to the fourth embodiment is the example of the second measuring part. Additionally, cycles of a clock signal CK equivalent to the number that "1" is subtracted from the CAS latency CL, namely, the time from data read operation at the SDRAM (R) to output of the data is the example of the first time, and the first flight time FT(1) and the second flight time FT(2) corresponding to the delay time for a signal to go between the controller (C) and the SDRAM (R) are the examples of the second time.

A data fetch circuit, which reliably masks transition of a high impedance state of a data strobe signal even if a manufacture condition or an operation condition is changed, and a control method thereof can be provided by application of the present embodiment.

What is claimed is:

1. A data fetch circuit that masks an input of an invalid data strobe signal when it fetches a data signal synchronously with a data strobe signal with the data signal in accordance with a read instruction signal comprising:

a response time measuring part measuring a response time from the input of the read instruction signal to a valid edge of the data strobe signal; and a standby part giving an instruction of a cancel of the mask of the data strobe signal after standing by for a standby time based on the response time in accordance with a standby start signal based on the read instruction signal, wherein the data strobe signal outputs the valid edge which makes a transition from a high impedance to a first logic level in accordance with the read instruction signal; and the response time measuring part comprises: a transition detecting part detecting the transition of the data strobe signal from the high impedance to the first logic level; and a measuring part measuring the response time from the input of the read instruction signal to an output of a detection result of the transition detecting part, and wherein the transition detecting part comprises: a first comparator in which the data strobe signal is inputted to an inversion input terminal and a first threshold voltage detecting the first logic level is inputted to a non-inversion input terminal; a second comparator in which an inversion data strobe signal complementary to the data strobe signal is inputted to a non-inversion input terminal and a second threshold voltage detecting the second logic level is inputted to an inversion input terminal; and a gate circuit that calculate an AND operation of outputs of the first and second comparators.

2. The data fetch circuit according to claim 1, wherein the response time measuring part makes measurement of the response time valid in accordance with a measurement instruction signal.

3. The data fetch circuit according to claim 1, wherein the response time measuring part comprises: a first counter part starting counting clock signals in accordance with the input of the read instruction signal; and a first holding part holding an output of the first counter part in accordance with the valid edge of the data strobe signal.

4. The data fetch circuit according to claim 3 further comprising a standby adjusting part adjusting to make the standby time delay by one cycle of the clock signal with reference to time which depends on holding contents of the first holding part.

5. The data fetch circuit according to claim 4, wherein the standby adjusting part includes a shifter which shifts the holding contents of the first holding part leftward.

6. The data fetch circuit according to claim 4, wherein the standby adjusting part includes a flip-flop which delays the read instruction signal by one cycle of the clock signal.

7. The data fetch circuit according to claim 3, wherein the first counter part includes a shift register to which the read instruction signal is inputted as a data input and the clock signal is inputted as a clock input.

8. The data fetch circuit according to claim 1, wherein the standby part includes a delay line to which the standby start signal is inputted and the response time measuring part includes a selecting part which selects an output tap of the delay line depending on the response time.

9. The data fetch circuit according to claim 8, wherein the selecting part sequentially switches an output tap of the delay line or an output tap of a delay line structurally same as the delay line and detects logic level of the data strobe signal within a time in which the read instruction signal to be inputted to the delay line is outputted with delay.

10. The data fetch circuit according to claim 8, wherein the selecting part includes: a delay line signal holding part which holds a signal of an output tap of the delay line to which the read instruction signal is inputted or a signal of an output tap of a delay line structurally same as the delay line depending on a valid edge of the data strobe signal of each output tap of the delay line; and a detecting part which specifies input timing of the read instruction signal from a signal held in the delay line signal holding part.

11. The data fetch circuit according to claim 9, wherein the read instruction signal is inputted to the delay line provided in the standby part during a measurement of the response time.

12. The data fetch circuit according to claim 10, wherein the read instruction signal is inputted to the delay line provided in the standby part during a measurement of the response time.

13. The data fetch circuit according to claim 1, wherein the response time measuring part includes: a first measuring part measuring a first time in the response time; and a second measuring part measuring a second time corresponding to rest of the response time from which the first time is excluded, and the standby start signal is outputted from the first measuring part and stands by at the standby part for time according to the second time.

14. The data fetch circuit according to claim 13, wherein the first time is a fixed time in the response time and the second time is a variable time in the response time.

15. The data fetch circuit according to claim 13, the first measuring part includes: a second counter part which starts counting a clock signal in response to an input of the read instruction signal; and a second holding part which holds an output of the second counter part depending on the valid edge of the data strobe signal.

16. The data fetch circuit according to claim 1 further comprising a delay adjusting part which variably delays at least one of the following items:

measuring timing of the response time meaning part and a measuring result of the standby part.

17. The data fetch circuit according to claim 16 wherein, in case measurement by at least the response time measuring part and the standby part is carried out in accordance with a clock signal, delay of measuring timing by the delay adjusting part is due to delay of a clock signal.

18. A data fetch system comprising:
a memory device which outputs a data signal synchronously with a data strobe signal; and
a memory control device which masks an input of an invalid data strobe signal when fetching the data signal synchronously with the data strobe signal,
wherein the memory control device includes: a response time measuring part measuring a response time from the input of the read instruction signal to a valid edge of the data strobe signal;
and a standby part giving an instruction of a cancel of the mask of the data strobe signal after standing by for a standby time based on the response time in accordance with a standby start signal based on the read instruction signal,
wherein the data strobe signal outputs the valid edge which makes a transition from a high impedance to a first logic level in accordance with the read instruction signal; and
the response time measuring part comprises: a transition detecting part detecting the transition of the data strobe signal from the high impedance to the first logic level; and a measuring part measuring the response time from the input of the read instruction signal to an output of a detection result of the transition detecting part, and
wherein the transition detecting part comprises: a first comparator in which the data strobe signal is inputted to an inversion input terminal and a first threshold voltage detecting the first logic level is inputted to a non-inversion input terminal; a second comparator in which an inversion data strobe signal complementary to the data strobe signal is inputted to a non-inversion input terminal and a second threshold voltage detecting the second logic level is inputted to an inversion input terminal; and a gate circuit that calculate an AND operation of outputs of the first and second comparators.

19. A control method of a data fetch circuit that masks an input of an invalid data strobe signal when it fetches a data signal synchronously with a data strobe signal with the data signal in accordance with a read instruction signal comprising:

measuring a response time from the input of the read instruction signal to a valid edge of the data strobe signal; and
giving an instruction of a cancel of the mask of the data strobe signal after standing by for a standby time based on the response time in accordance with a standby start signal based on the read instruction signal,
wherein the data strobe signal outputs the valid edge which makes a transition from a high impedance to a first logic level in accordance with the read instruction signal; and
the measuring the response time comprises: detecting the transition of the data strobe signal from the high impedance to the first logic level; and measuring the response time from the input of the read instruction signal to an output of a detection result of the detecting the transition, and
wherein the detecting the transition comprises: (1) comparing that the data strobe signal being inputted as an inversion input and a first threshold voltage detecting the first logic level being inputted as a non-inversion input; (2) comparing that an inversion data strobe signal complementary to the data strobe signal being inputted as a non-inversion input and a second threshold voltage detecting the second logic level being inputted as an inversion input terminal; and (3) calculating an AND operation of outputs of the (1) comparing and the (2) comparing.

20. The control method of a data fetch circuit according to claim 19, wherein the measuring the response time further comprises making measurement of the response time valid in accordance with a measurement instruction signal.

21. The control method of a data fetch circuit according to claim 19, wherein the measuring the response time comprises: starting counting clock signals in accordance with the input of the read instruction signal; and holding a count result of the starting the counting clock signals in accordance with the valid edge of the data strobe signal.

22. The control method of a data fetch circuit according to claim 19, wherein
the giving the instruction of a cancel of the mask comprises delaying a signal by a delay line in response to the read instruction signal, and
the measuring the response time comprises selecting an output tap of the delay line in accordance with the response time.

23. The control method of a data fetch circuit according to claim 22, wherein
the selecting the output tap of the delay line comprises switching sequentially an output tap of the delay line or an output tap a delay line structurally same as the delay line, and
the sequentially switching sequentially the output tap of the delay line comprises detecting logic level of the data strobe signal within a time in which the read instruction signal to be inputted to the delay line is outputted with delay.

24. The control method of a data fetch circuit according to claim 22, wherein the selecting the output tap of the delay line comprises: holding a signal of an output tap of the delay line to which the read instruction signal is inputted or a signal of an output tap of a delay line structurally same as the delay line depending an on valid edge of the data strobe signal of each output tap of the delay line; and specifying input timing of the read instruction signal from a signal held at the holding the signal of an output tap of the delay line.

25. The control method of a data fetch circuit according to claim 19, wherein
the measuring the response time comprises: measuring a first time in the response time; and measuring a second time corresponding to rest of the response time from which the first time is excluded, and
the giving the instruction of the cancel of the mask stands by for a time according to the second time.

26. The control method of a data fetch circuit according to claim 25, wherein the first time is a fixed time in the response time and the second time is a variable time in the response time.

27. The control method of a data fetch circuit according to claim 25, wherein the measuring the first time comprises: starting to count a clock signal in response to an input of the read instruction signal; and holding a count result at the measuring the first time.

* * * * *